United States Patent
Derhacobian

(10) Patent No.: US 8,995,173 B1
(45) Date of Patent: Mar. 31, 2015

(54) MEMORY CELLS, DEVICES AND METHOD WITH DYNAMIC STORAGE ELEMENTS AND PROGRAMMABLE IMPEDANCE SHADOW ELEMENTS

(75) Inventor: Narbeh Derhacobian, Belmont, CA (US)

(73) Assignee: Adesto Technologies Corporation, Sunnyvale, CA (US)

(*) Notice: Subject to any disclaimer, the term of this patent is extended or adjusted under 35 U.S.C. 154(b) by 157 days.

(21) Appl. No.: 13/603,373

(22) Filed: Sep. 4, 2012

Related U.S. Application Data

(60) Provisional application No. 61/540,539, filed on Sep. 29, 2011.

(51) Int. Cl.
*G11C 11/24* (2006.01)
*G11C 11/401* (2006.01)

(52) U.S. Cl.
CPC .................................. *G11C 11/401* (2013.01)
USPC .............. 365/149; 365/63; 365/148; 365/222

(58) Field of Classification Search
USPC .................................... 365/149, 148, 63, 222
See application file for complete search history.

(56) References Cited

U.S. PATENT DOCUMENTS

| | | | |
|---|---|---|---|
| 5,761,115 A | 6/1998 | Kozicki et al. | |
| 6,635,914 B2 | 10/2003 | Kozicki | |
| 6,927,411 B2 | 8/2005 | Kozicki | |
| 7,027,326 B2 * | 4/2006 | Luk et al. | 365/175 |
| 7,233,515 B2 | 6/2007 | Rohr | |
| 7,254,052 B2 * | 8/2007 | Liaw | 365/148 |
| 7,337,282 B2 | 2/2008 | Happ et al. | |
| 7,372,716 B2 | 5/2008 | Roehr et al. | |
| 7,385,837 B2 * | 6/2008 | Perner | 365/148 |
| 7,660,175 B2 * | 2/2010 | Kohlert et al. | 365/201 |
| 7,701,752 B2 * | 4/2010 | Luk et al. | 365/149 |
| 7,933,139 B2 * | 4/2011 | Lung | 365/148 |
| 8,331,128 B1 | 12/2012 | Derhacobian et al. | |
| 8,531,863 B2 | 9/2013 | Symanczyk et al. | |
| 8,687,403 B1 | 4/2014 | Derhacobian et al. | |
| 2007/0002619 A1 | 1/2007 | Schoenauer et al. | |

* cited by examiner

Primary Examiner — Pho M Luu

(57) ABSTRACT

A memory device can include a plurality of memory cells, each including a dynamic section configured to store data dynamically, and a programmable impedance section comprising at least one programmable element programmable between at least two different data states, the programmable impedance section configured to establish a data value stored by the dynamic section in response to a recall signal.

20 Claims, 7 Drawing Sheets

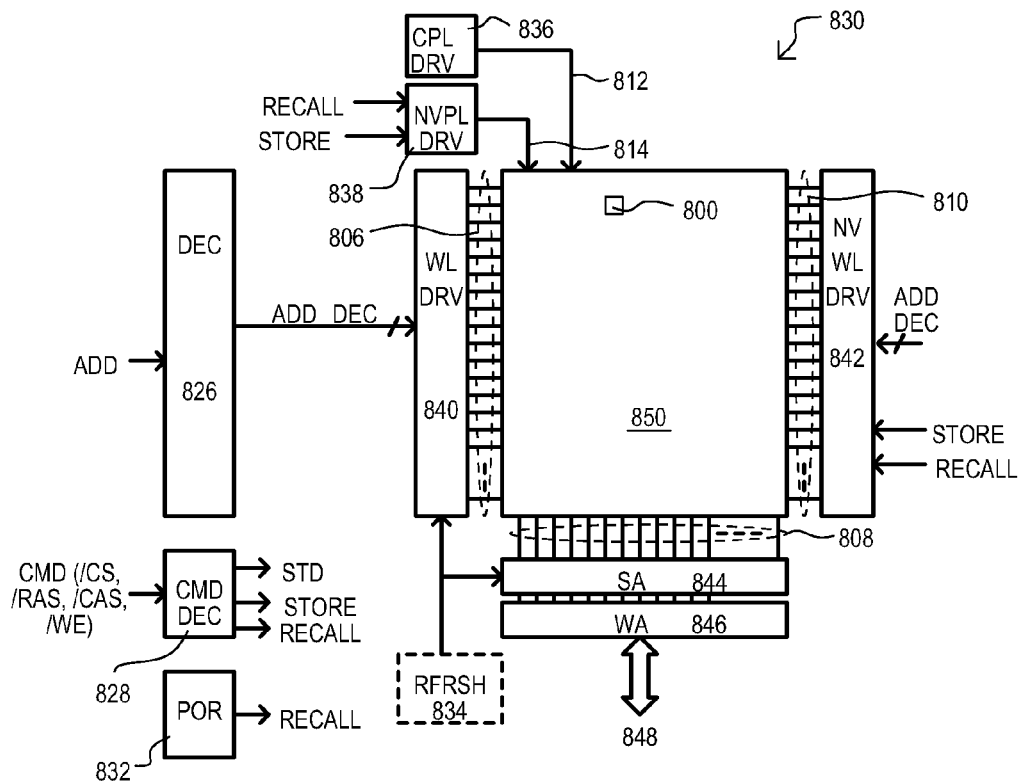
FIG. 8
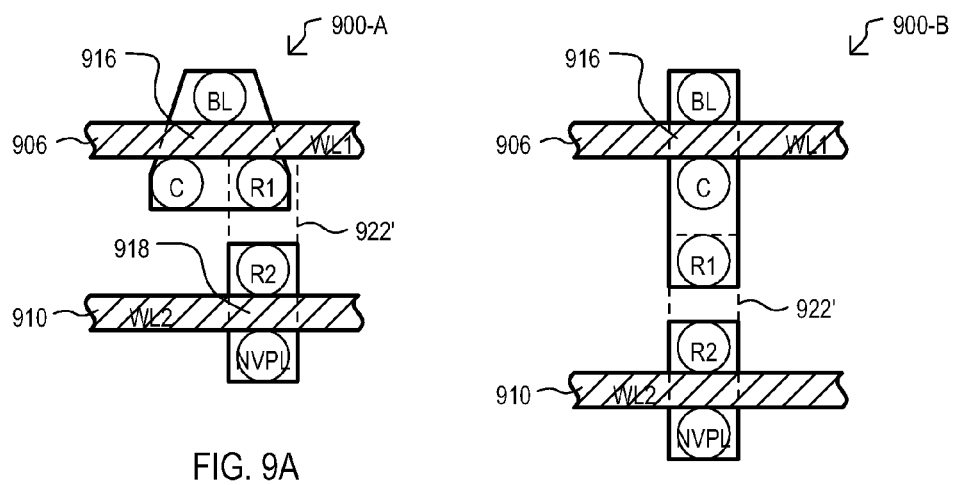
FIG. 9A
FIG. 9B

MEMORY CELLS, DEVICES AND METHOD WITH DYNAMIC STORAGE ELEMENTS AND PROGRAMMABLE IMPEDANCE SHADOW ELEMENTS

This application claims the benefit of U.S. provisional patent application Ser. No. 61/540,539, filed on Sep. 29, 2011, the contents of which are incorporated by reference herein.

TECHNICAL FIELD

The present disclosure relates generally to memory devices, and more particularly to memory devices with memory cells that include both dynamic storage elements and programmable impedance elements.

BACKGROUND

Dynamic random access memories (DRAMs) include memory cells with dynamic storage elements (i.e., capacitors). DRAM memory cells can have the disadvantages of being volatile (i.e., losing a stored data value in the absence of power) and of requiring refresh (i.e., data values must be re-written periodically to avoid losing data). At the same time, DRAMs can operate at relatively low power consumption levels, and can provide relatively fast data access speeds for read and write operations.

Accordingly, in systems employing DRAMs, when the power is removed, the last data stored by a DRAM can be lost. If such data is needed when power is turned back on, such data must be reloaded (re-booted) back into the DRAM. To avoid loss of data, such systems typically include a storage capability separate from the DRAM device, such as a nonvolatile storage integrated circuit (chip) or other nonvolatile storage, such as a hard disk drive.

In some conventional systems, such as data servers, when the power is accidentally shut down, data recovery can be very costly and time consuming, as large amounts of data stored in hard disk drivers, or the like, must be reloaded back into DRAM memory and/or and entire system must restore from a previous back-up point, losing any data occurring after the back-up point.

BRIEF DESCRIPTION OF THE DRAWINGS

FIG. 8 is a block schematic diagram of a memory device according to another embodiment.

FIGS. 9A to 9D are to plan views of memory cells according to various embodiments.

DETAILED DESCRIPTION

Figure 1:
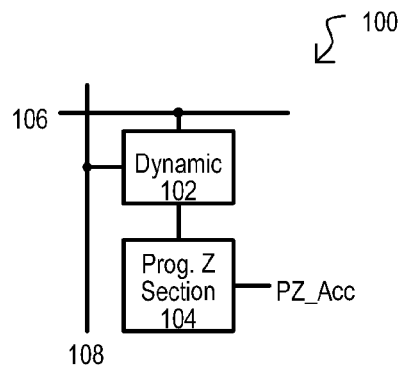
FIG. 1 is a schematic diagram of a memory cell according to one embodiment.

Embodiments disclosed herein show memory cells, devices and methods having both dynamic storage elements and programmable impedance elements. In certain modes of operations, dynamic storage elements can be accessed for read and write operations at high speeds. Programmable impedance elements can "shadow" the dynamic storage elements by storing the same data values as the dynamic storage elements. When use of dynamic storage elements is no longer needed or desirable (due to power consumption or the like), data values stored in the dynamic elements can be stored in the programmable impedance elements. In some embodiments, this can enable data to be stored in a nonvolatile or quasi-nonvolatile fashion. Further, when it is once again desirable to use the dynamic storage elements, data values can be loaded from the programmable impedance elements back into the dynamic storage elements.

In the various embodiments below, like items will be referred with the same reference character, but with the leading digit(s) corresponding to the figure number.

FIG. 1 is a block schematic diagram of a memory cell 100 according to a first embodiment. A memory cell 100 can include a dynamic section 102 and a programmable impedance section 104. In the embodiment shown, memory cell 100 can be connected to a word line 106 and a bit line 108. It is understood that a memory cell 100 can be repeated numerous times in an array, with memory cells of a same column being connected to a same bit line 108, and memory cells of a same row being connected to a same word line 106.

A dynamic section 102 can store a data value in a dynamic fashion, losing a stored data value in the absence of applied power. A dynamic section 102 can be connected to bit line 108 and word line 106. In such an arrangement, a data value can be read from and written into a dynamic section 102.

A programmable impedance section 104 can include one or more programmable impedance elements that can be programmed into two or more impedance states. A programmable impedance section 104 can connect its programmable impedance element 104 to the dynamic section 102 in response to an access signal PZ_Acc.

Having described the general sections of a memory cell 100, operations of the memory cell will now be described.

FIGS. 2A to 2D show various operations of memory cell 100 according to embodiments.

Figures 2A, 2B:
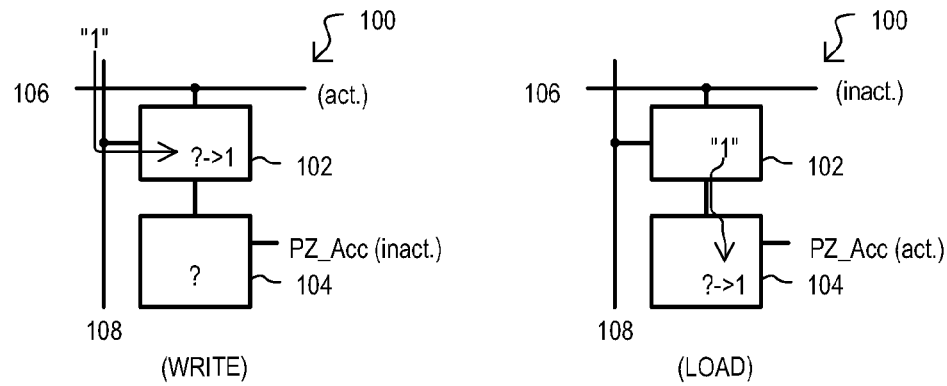
FIGS. 2A to 2D are a schematic showing operations of a memory cell like that of FIG. 1.

FIG. 2A shows a WRITE operation to memory cell 100 according to one embodiment. In a WRITE operation, a word line 106 can be driven to an active level, connecting dynamic section 102 to bit line 108. Bit line 108 can be driven to a potential according to a write data value. In FIG. 2A, this is represented by a "1" value. According to a potential of bit line

108, a data value stored by dynamic section 102 can be set to store one value (shown as ?→1).

In the embodiment shown, in a WRITE operation, PZ_Acc can be driven to an inactive level, isolating programmable impedance section 104 from dynamic section 102.

A WRITE operation can be conceptualized as a "standard" operation, as it accesses the dynamic section 102 and not the programmable impedance section 104. As such, a WRITE operation can have a same or similar performance of a conventional dynamic memory device.

FIG. 2B shows a LOAD operation for memory cell 100 according to one embodiment. In a LOAD operation, a word line 106 can be driven to an inactive level, isolating dynamic section 102 from bit line 108. At the same time, PZ_Acc can be driven to an active level, connecting programmable impedance section 104 to dynamic section 102. According to such a connection, programmable impedance element(s) within programmable impedance section 104 can be programmed to store the data value stored by the dynamic section (shown as ?→1).

A LOAD operation can be considered a non-standard operation, as it stores data in programmable impedance elements. Such an action can store data in a nonvolatile or quasi-nonvolatile fashion. In the nonvolatile case, a data value can be stored in programmable impedance section 104 in the absence of power. In the quasi-nonvolatile case, programmable impedance section 104 can store a data value for longer periods of time than a dynamic section 102. In some embodiments, such storage times can be orders of magnitude longer than a dynamic section 102. For example, if a dynamic section refreshes data at a rate of every tens or hundreds of microseconds, a programmable impedance section can retain data values on the order of milliseconds, seconds, minutes, or hours.

Figures 2C, 2D:
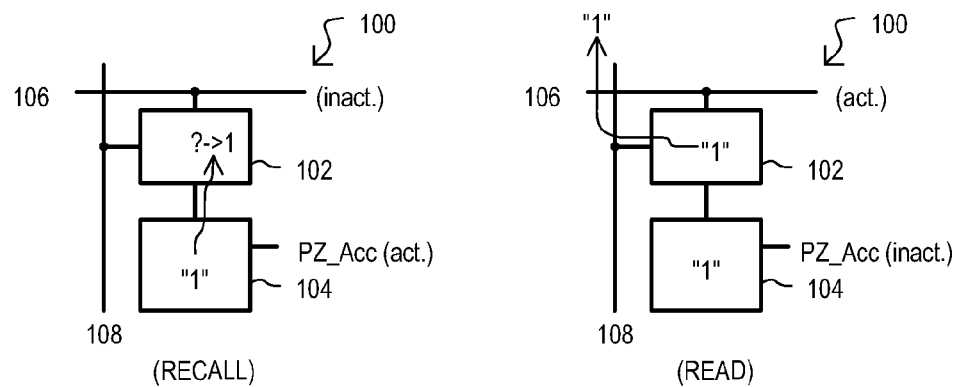

FIG. 2C shows a RECALL operation for memory cell 100 according to one embodiment. In a RECALL operation, a word line 106 can be driven to an inactive level, isolating dynamic section 102 from bit line 108. PZ_Acc can be driven to an active level, connecting programmable impedance section 104 to dynamic section 102. According to such a connection, programmable impedance element(s) within programmable impedance section 104 can establish the data value stored in dynamic section (shown as ?→1).

Like the LOAD operation, a RECALL operation can be considered a non-standard operation, as it accesses programmable impedance elements.

FIG. 2D shows a READ operation from memory cell 100 according to one embodiment. In a READ operation, a word line 106 can be driven to an active level, connecting dynamic section 102 to bit line 108. According to a data value stored by dynamic section 102, a bit line 108 can be driven to a potential (or can draw a particular current). This is represented by the "1" being placed on bit line 108.

In the embodiment shown, in a READ operation, PZ_Acc can be driven to an inactive level, isolating programmable impedance section 104 from dynamic section 102.

A READ operation can be conceptualized as a "standard" operation, as it accesses the dynamic section 102 and not the programmable impedance section 104. As such, like the WRITE operation, a READ operation can have a same or similar performance of a conventional dynamic memory device.

Figure 3:
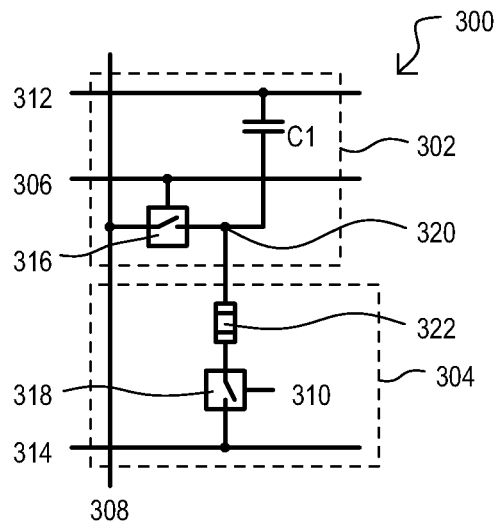
FIG. 3 is a schematic diagram of a memory cell according to another embodiment having a capacitor as a dynamic storage element and a programmable impedance element directly connected to a storage node.

FIG. 3 is a schematic diagram of a memory cell 300 according to another embodiment. In a very particular embodiment, memory cell 300 can be one implementation of that shown in FIG. 1.

A memory cell 300 can include a dynamic section 302 and programmable impedance section 304. A dynamic section 302 can be a dynamic RAM section formed by a first access device 316 and a storage capacitor C1. A first access device 316 can be connected between a bit line 308 and capacitor C1, and can have a control terminal connected to a first word line 306. Capacitor C1 can have one terminal connected to a storage node 320 and another terminal connected to a first common node 312.

Capacitor C1 can store (or not store) charge to indicate a data value in a dynamic fashion. In some embodiments, first common node 312 can be a capacitor plate common to multiple storage capacitors. Capacitor C1 can have a bit-line-over-contact (BOC) configuration, a capacitor-over-bit line (COB) configuration, or can be a trench type capacitor, including a trench capacitor with a substrate plate, or a trench capacitor with a substrate storage node.

A programmable impedance section 304 can include a second access device 318 and a programmable impedance element 322. In the embodiment shown, a second access device 318 can be connected between programmable impedance element 322 and second common node 314, and can have a control terminal connected to a second word line 310. A programmable impedance element 322 can be a two terminal element having one terminal connected to storage node 320 and another terminal connected to second access device 318.

A programmable impedance element 322 can be programmed between two or more impedance states by application of an electric field. In one embodiment, element 322 can be programmed between at least two different resistance states. In some embodiments, an element 322 can include a solid ion conductor layer formed between two electrodes. In very particular embodiments, an element 322 can be a programmable metallization cell (PMC) (also referred to as a conductive bridging random access memory (CBRAM) type cell). In some PMC embodiments, an element 322 can include an active electrode (anode) and an indifferent electrode (cathode) with a solid ion conductor layer formed between. An active electrode can be a source of conductive ions that can establish the impedance state of the PMC.

Either of the access devices 316/318 can be an active circuit element, including any suitable transistor. In particular embodiments, access devices 316/318 can be insulated gate field effect (e.g., MOS) type transistors. Either access device 316/318 can be formed in a semiconductor substrate. In addition or alternatively, either of access devices 316/318 can be a thin-film transistor formed over a substrate.

A memory cell 300 can be conceptualized as having two modes of operation.

In one mode of operation, a memory cell 300 can operate in a standard DRAM like fashion, accessing dynamic section 302, while programmable impedance section 304 remains isolated from dynamic section 302. In this mode, first access device 316 can be enabled according to a signal on first word line 306, connecting bit line 308 to storage node 320. At the same time, second access device 318 can be disabled according to a signal on second word line 310, isolating element 322 from common node 314.

In this mode of operation, data can be written into the dynamic section 302 by driving bit line 308 to a predetermined potential, while maintaining first common node 312 at one potential. Thus, capacitor C1 can be charged or not charge via bit line 308 to store a data value. Similarly, data can be read from dynamic section 302 by enabling first access device 316 to allow charge (or lack of charge) to be shared with bit line 308, depending upon a charged state of capacitor C1.

In another mode of operation, a memory cell 300 can enable data held in the dynamic section 302 to be stored in programmable impedance section 304, or loaded from programmable impedance section 304 into the dynamic section 302. In this mode, first access device 316 can be disabled according to a signal on first word line 306, isolating bit line 308 from storage node 320. At the same time, second access device 318 can be enabled according to a signal on second word line 310, connecting element 322 to common node 314.

In this mode of operation, a programmable impedance element 322 can be programmed by driving second common node 314 to a predetermined potential, while a charge state of capacitor C1 establishes a potential on storage node 320. If a sufficient voltage is created across element 322, the element 322 can be programmed to an impedance state. Similarly, a capacitor C1 can be charged according to a state of element 322 by driving common nodes 312 and 314 to different potentials. In such an arrangement, capacitor C1 can be charged or not charged according to a programmed resistance of element 322.

Figure 4:
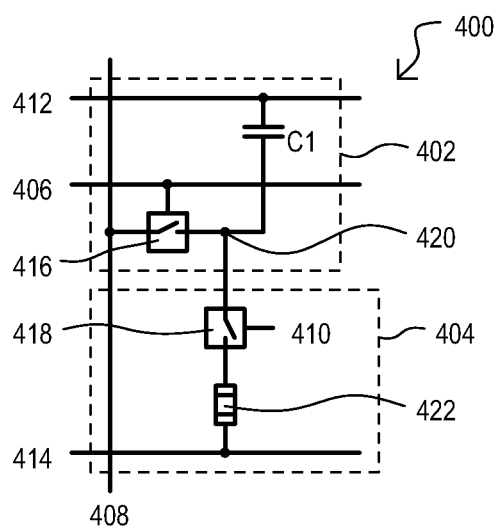
FIG. 4 is a schematic diagram of a memory cell according to a further embodiment having a capacitor as a dynamic storage element and a programmable impedance element connected to a storage node by an access device.

FIG. 4 is a schematic diagram of a memory cell 400 according to another embodiment. FIG. 4 includes items like those of FIG. 3, and such like items are referred to by the same reference character but with the first digit being "4". FIG. 4 differs from FIG. 3 in that a second access device 418 can be connected between storage node 420 and programmable impedance element 422.

The memory cell 400 of FIG. 4 can operate in the same general fashion as described for FIG. 3.

Figure 5:
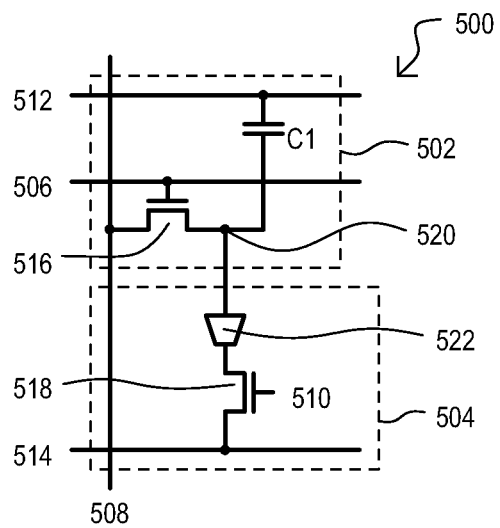
FIG. 5 is a schematic diagram of a memory cell according to another embodiment having a capacitor as a dynamic storage element and a programmable metallization cell (PMC) as a programmable storage element.

FIG. 5 is a schematic diagram of a memory cell 500 according to another embodiment. FIG. 5 includes items like those of FIG. 3, and such like items are referred to by the same reference character but with the first digit being "5". FIG. 5 differs from FIG. 3 in that access devices 516/518 are shown as n-channel insulated gate field effect (MOS type) transistors, and programmable impedance element 522 can be a PMC type element, having a solid ion conductor formed between two electrodes. PMC element 522 can have an anode connected to storage node 520 and a cathode connected to second access device 518.

It is understood that while FIG. 5 shows a memory cell like that of FIG. 3, alternate embodiments can include a configuration like that of FIG. 4. Further, either of access devices can be p-channel MOS type transistors. Further, the anode-cathode connection can be switched (i.e., a cathode can be connected to a storage node and an anode can be connected to a second common node).

Figure 6:
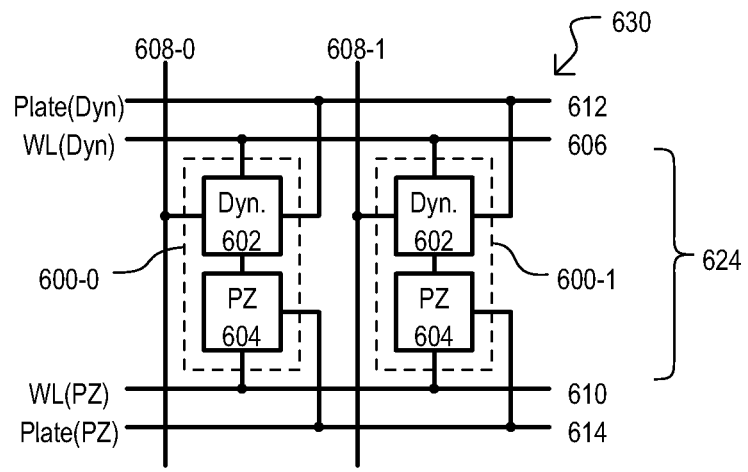
FIG. 6 is a block schematic diagram of a memory device according to an embodiment.

FIG. 6 is a block schematic diagram showing a memory device 630 according to one embodiment. A memory device 630 can include memory cells 600-0/1 arranged into at least one row 624. Memory cells 600-0/1 of a same row can be commonly connected to same first and second word lines 606/610 and first and second common nodes 612/614. Memory cells 600-0/1 can each be connected to different bit lines 608-0/1.

Memory cells 600-0/1 can take the form of any of those shown herein, or equivalents, including a dynamic section 602 and a programmable impedance section 604.

Any of the READ, WRITE, LOAD, and RECALL operations can be performed on memory cells (600-0/1) in parallel. That is, data can be read from memory cells (600-0/1) on bit lines (608-0/1) simultaneously. Data can be written into memory cells (600-0/1) from bit lines (608-0/1) simultaneously. Further, data can be stored into programmable impedance sections 604 from dynamic sections 602 in parallel, and recalled from programmable impedance sections 604 into dynamic sections 602 in parallel.

According to some embodiments, a memory device can be a DRAM with PMC type cells operating as "shadow" cells to the DRAM cells. A PMC type shadow cell can store a data value for a longer period of time than a DRAM cell, and in some embodiments, can be a nonvolatile storage cell.

In some embodiments, PMC type cells can be introduced into an existing DRAM process, without disturbing the base DRAM process. As but one example, PMC type cells can be compatible with low voltage levels of a DRAM cell array, and hence would not include transistors operating at a higher voltage, as can be case with other nonvolatile technologies, such flash type electrically erasable and programmable read only memory (EEPROM) type cells.

In addition or alternatively, all or portions of a PMC section (such as PMC elements) can be introduced at the back end of line (BEOL), after transistors and/or storage capacitors have been formed at the front end of line (FEOL).

According to some embodiments, a memory device can include one or more non-volatile programmable impedance memory elements, such as PMC type elements, used in conjunction with each DRAM cell. PMC type elements can operate as shadow storage elements. Data held by DRAM cells can be stored in PMC elements with a STORE operation. Data stored by PMC elements can then be recalled back into the DRAM cells with a RECALL operation.

In standard type operations, memory cells can operate like conventional DRAM cells, thus maintaining DRAM-like performance, and enabling the memory device to have a DRAM interface for compatibility with existing systems.

When a user desires, or in the event of certain conditions, a STORE operation can be executed, and the data stored in the DRAM cells can be programmed into the PMC elements. Subsequently, when a user desires, or in the event of certain conditions, data stored by PMC elements can be reloaded into the DRAM cell with a RECALL operation.

Figure 7:
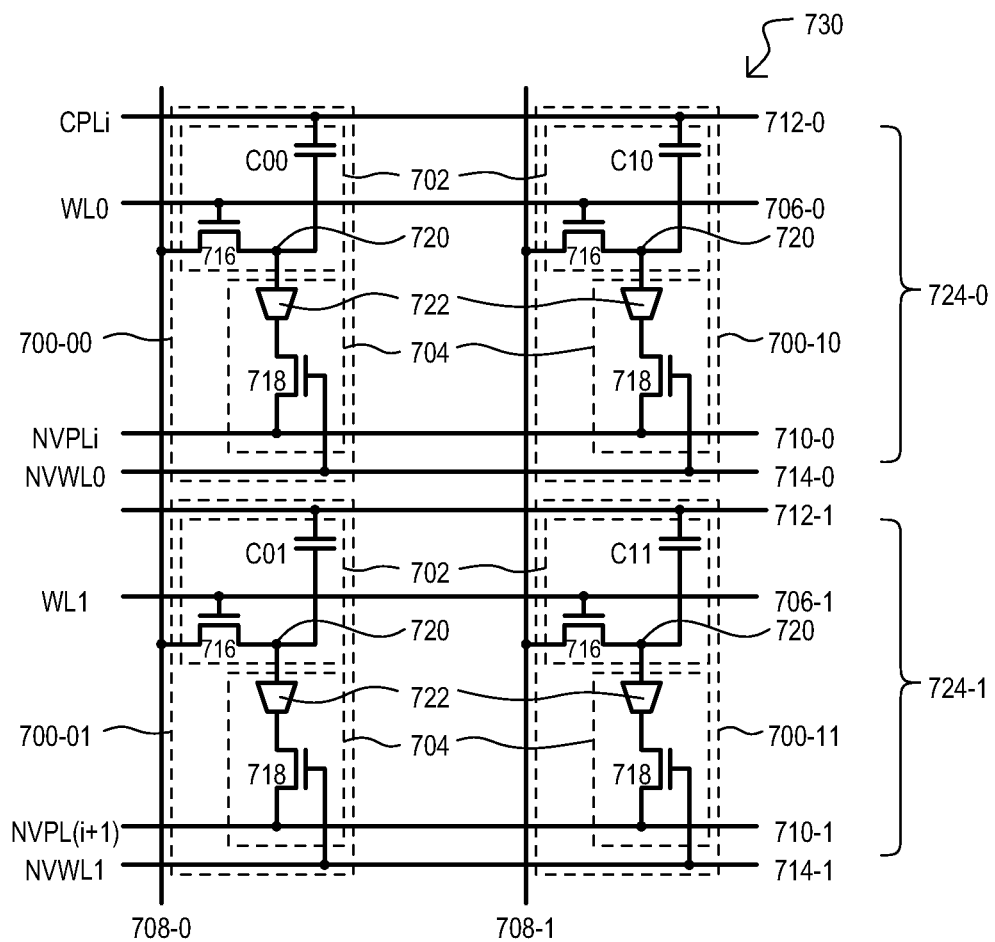
FIG. 7 is a block schematic diagram of a memory device according to a further embodiment.

FIG. 7 is a schematic diagram of a memory device 730 formed with memory cells like those shown in FIG. 5. Like items are referred to with the same reference character but with the first digit being a "7" instead of a "5". Further, FIG. 7 shows a two-by-two array of memory cells.

It is understood that in some embodiments, first common nodes 712-0/1 can be driven together, separately, or represent a same common node. Similarly, second common nodes 714-0/1 can be driven together, separately, or be part of a same node.

Along these same lines, while in some embodiments, second word lines 710-0/1 can be connected to a same number of cells as first word lines 706-0/1, in other embodiments, second word lines 710-0/1 can be connected to a different number of cells than corresponding first word lines 706-0/1. Further, second word lines 710-0/1 can be driven separately or at the same time.

Operations of the memory device 730 will now be described.

READ (Dynamic): In a one type of read operation, second word lines 710-0/1 can be driven to inactive levels, causing second access devices 718 to be disabled (placed into high impedance states). To access data from dynamic sections 702 of a particular row 724-0/1, an appropriate first word line 706-0/1 can be driven to an active level. This can enable the first access devices 716 of the selected row. Charge stored in the storage capacitors of the row can be shared with the corresponding bit lines 708-0/1. A stored data value can be determined according to the charge (or lack thereof) placed on the bit lines 708-0/1. Once such data values have been read from dynamic sections 702, or in the process of reading the data values, the data values can be refreshed (e.g., capacitors will be recharged if previously charged, or maintained in a discharged state if previously discharged).

WRITE (Dynamic): In a one type of write operation, second word lines 710-0/1 can be off (inactive), disabling second access devices 718 (placing them in high impedance states). Data can be driven on the bit lines 708-0/1, and one of the first word lines 706-0/1 can be activated. This can enable the first access devices 716 of the corresponding activated row 724-0/1. According to the voltages on the bit lines 708-0/1, the capacitors (C00 to C11) of the row can be charged (or not charged). Subsequently, the first access devices 716 of the row can be turned off, isolating the capacitors (C00 to C11), to retain the written data values. Refresh operations can be an automatic write operation based on read values.

STORE: In a store operation, a resistance of a PMC type element 722 can be programmed according to a state of the corresponding storage node 720. In some embodiments, prior to a store operation, all PMC type elements 722 can be in about a same resistance state. In one embodiment, resistance states can include a high resistance state (HRS) or a low resistance state (LRS). It is assumed for this description that HRS implies logical state "0" and LRS state implies logical state "1". In one embodiment, in a STORE operation, each DRAM cell can contain a "1" (charge on the storage capacitor) or "0" (substantially no charge on the capacitor).

When a STORE operation is commenced, first word lines 706-0/1 can be driven to inactive levels, turning off first access devices 716. In addition, one or more second word lines 714-0/1 can be driven to active levels, while a corresponding second common node 714-0/1 is driving to a low potential (e.g., zero volts). Then, if a storage node 720 is charged by its corresponding capacitor (C00 to C11), this charge can be dumped into the PMC type element 722, and the element can change from a HRS to a LRS (i.e., a data 1 can be written into the PMC section 704). In contrast, if the storage node 720 does not have charge at this time, then the PMC type element 722 can remain in its HRS state (i.e., continue to store a data 0).

In some embodiments, a STORE operation can occur in response to a device entering a particular mode. For example, STORE operations can be executed when entering a deep standby mode (very low power consuming state), or prior to a device being turned off. Thus, data stored dynamically in capacitors can be stored in a nonvolatile fashion (or an otherwise significantly longer time) without the power needed for a refresh (or without power at all).

It is understood that in some embodiments, STORE operations can be performed on a row-by-row basis, for example, with the same data granularity as READ or WRITE operations. However, in other embodiments, STORE operations can occur on multiple rows at the same time.

RECALL: In a recall operation, according to the states of PMC type elements 722, data storage nodes 720 can be charged and, thus be available for sampling by dynamic (i.e., DRAM) circuitry. For example, first word lines 706-0/1 can be driven to inactive levels, while first common nodes 712-0/1 are driven to low voltage levels.

At the same time, second word lines 710-0/1 can be driven to active levels, and second common node(s) 714-0/1 can be at some positive voltage. If a PMC type element 722 is programmed to a Data 1 state (e.g., it has a LRS), then it will pass on the voltage from the second common node 714-0/1 to the data storage node 720, thereby charging the corresponding capacitor (C00 to C11) to store a data "1" in the dynamic section (702). On the other hand, if the PMC type element 722 is programmed to a Data 0 state (e.g., it as a HRS), then the voltage on the second common node 714-0/1 substantially does not pass through to the storage node 720, and the corresponding capacitor (C00 to C11) is substantially not charged (e.g., a data "0" can be stored in the dynamic section 702).

In some embodiments, a RECALL operation can occur in response to power being returned to a device, or the device awakening from deep sleep mode.

As noted for the STORE operation, RECALL operations can have the same granularity as READ and WRITE operations, or can have a different granularity.

FIG. 8 is a block schematic diagram of a memory device 830 according to an embodiment. A memory device 830 can form part or all of an integrated circuit device. In the embodiment shown, a memory device 830 can include a memory cell array 850, a first word line driver 840, a second word line driver 842, a first plate driver 836, a second plate driver 838, an address decoder 826, a command decoder 828, a power-on reset (POR) circuit 832, sense amplifiers 844, write amplifiers 846, and an input/output (I/O) path 848. Optionally, a memory device 830 can include refresh control circuits 834.

A memory cell array 850 can include memory cells (one shown as 800), arranged into rows and columns. Memory cells (e.g., 800) can include dynamic sections and programmable impedance sections as described herein, or equivalents. Memory cells (e.g., 800) of a same row can be commonly connected to first and second word lines (806, 810), as well as first and second common nodes (812, 814). It is understood that an array 802 can have a hierarchy of bit lines and word lines, including global word lines that are connectable to sets of first or second word lines, as well as global bit lines that are connectable to sets of bit lines. As indicated for embodiments herein, there can be multiple first and/or second common nodes (812, 814), and the granularity of such common nodes can be different than those of first or second word lines (e.g., word lines can be connected to a subset of the memory cells connected to a common node).

A first word line driver 840 can drive first word lines 806 in response to decoded address data. In one embodiment, a first word line driver 840 can drive first word lines 806 individually, to enable READ and WRITE operations, as described herein.

A second word line driver 842 can drive second word lines 806 in response to decoded address data and/or mode data (shown as STORE, RECALL). In one embodiment, a second word line driver 842 can drive groups of second word lines 810 to enable STORE and RECALL operations, as described herein.

A first plate driver 836 can drive one or more first common nodes 812 between different bias voltages according to the type of operation. In one very particular embodiment, a first plate driver 836 can drive first common node(s) 812 to one potential during READ and WRITE operations to enable a dynamically stored value to be read. Such a potential can be a low potential (e.g., low power supply voltage VSS) or an intermediate potential (e.g., halfway between a low and high power supply voltage (VDD−VSS)/2). During LOAD and RECALL operations, a first plate driver 836 can drive first common node(s) 812 to potential suitable for programming impedance elements and/or reading data from programmable impedance elements. In one embodiment, first common node(s) 812 can be driven to a low power supply voltage (VSS) in LOAD and RECALL operations.

As in the case of first plate driver 836, a second plate driver 838 can drive one or more second common nodes 814 between different bias voltages according to the type of operation. In one very particular embodiment, a second plate driver 838 can maintain second common node(s) 814 to one potential during READ and WRITE operations to isolate programmable impedance sections from dynamic sections. Such a potential can be a low power supply potential (e.g., VSS). During LOAD and RECALL operations, a second plate driver 838 can drive second common node(s) 814 to potential suitable for programming impedance elements and/or transferring data from programmable impedance elements to dynamic sections. In one embodiment, second common node(s) 814 can be driven to a low power supply voltage (e.g., VSS) in a LOAD operation, and a high power supply voltage (e.g., VDD) in a RECALL operation.

An address decoder 826 can decode received address values (ADD) to generate decoded address values for selecting first and/or second word lines. In one very particular embodiment, an address decoder 826 can present a conventional interface, such as a standard DRAM interface.

A command decoder 828 can decode received input values (CMD) to establish a mode of operation. Such modes of operation can include conventional READ and WRITE operations. In one very particular embodiment, command decoder 828 can present a conventional interface, such as a DRAM interface, that can receive conventional interface signals, including but not limited to /CS, /RAS, /CAS, and /WE signals. In the embodiment shown, a command decoder 828 can indicate standard operations (STD), which can include READ and WRITE operations noted herein. In addition, command decoder 828 can generate indications for STORE and RECALL operations. In some embodiments, additional input values (CMD) can generate STORE and RECALL indications.

A POR circuit 832 can generate a RECALL indication in response to the occurrence of one or more predetermined events occurring for memory device 830. In particular embodiments, a RECALL indication can be activated in response to a power-on or reset event for memory device 830.

Sense amplifiers (SAs) 844 can sense data values from dynamic sections of memory cells (e.g., 800) in a READ operation. In particular embodiments, SAs 844 can also refresh data in dynamic sections of memory cells in a READ operation. That is, when data are read, bit lines are driven to levels sufficient to refresh dynamic sections of memory cells (e.g., 800). Write amplifiers (WAs) 846 can drive bit lines 806 to enable data values to be written into dynamic sections of memory cells (e.g., 800) in a WRITE operation.

An I/O path 848 can provide input (write) data paths as well as output (read) data paths from the memory device 830. In some embodiments, an I/O path 848 can be bi-directional (DQ), with same data lines providing read data and receiving write data. In other embodiments, an I/O path 848 can be uni-directional, having one data path for read data (Q) and another for write data (D).

If included, refresh control circuits 834 can periodically access memory cells (e.g., 800), reading data from dynamic sections, and writing such data values back into the dynamic sections. In embodiments, in which programmable impedance elements are quasi-nonvolatile or volatile, refresh control circuits 834 can also periodically access programmable impedance sections within memory cells (e.g., 800), and read data from and write data back into the programmable impedance elements. However, refreshing of programmable impedance elements can occur at a substantially lower rate than dynamic sections of memory cells (e.g., 800).

In embodiments without refresh circuits, refresh operations can be executed by periodically issuing READ commands, assuming such READ commands refresh data values in dynamic sections.

FIGS. 9A to 9D are top plan views of memory cells according to some embodiments. In FIGS. 9A to 9D, memory cells (900-A/B/C/D) can dynamically store data with a storage capacitor, and include one programmable impedance element to STORE data from the capacitor and RECALL data into the capacitor.

Each of FIGS. 9A to 9D shows a first word line 906, which can form a first access device 916, a second word line 910, which can form a second access device 918. Also shown, are bit line contacts (BL), which can provide vertical connection to a bit line, a storage capacitor contact (C), which can provide a contact to a storage capacitor plate, a first element contact (R1), which can be connected to a first terminal of a programmable impedance element, and a second element contact (R2), which can be connected to a second terminal of a programmable impedance element. An NVPL contact can provide vertical connection to a second common node.

FIGS. 9A and 9B show embodiments where a capacitor contact (C) and element contact (R1) can share a diffusion region of transistor 916. It is understood that a programmable impedance element 922' can be connected between contacts R1 and R2. Further, a storage capacitor (not shown) can have one plate connected to capacitor contact (C), and another plate connected to a first common node (both not shown).

Figure 9C:
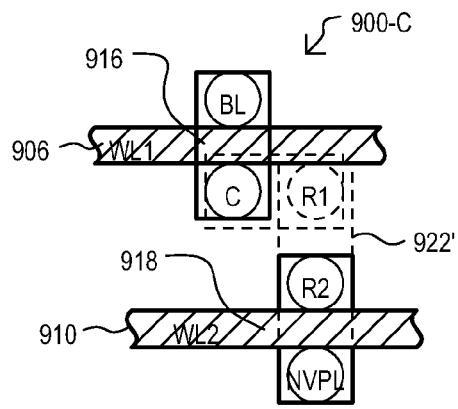

FIG. 9C shows an embodiment where a first of the contacts (in this case C) can have a direct connection to a diffusion region of first transistor 916, while a second of the contacts (in this case R1) can be connected to the same diffusion through the first contact. It is understood that such an arrangement could be reversed, with a contact R1 having a direct connection to a transistor diffusion region, while a capacitor contact (C) can be connected to the diffusion region through the contact R1.

FIGS. 9A to 9C can be very particular implementations of that shown in FIGS. 3 and/or 6.

Figure 9D:
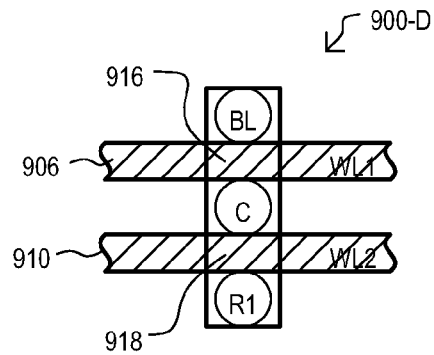

FIG. 9D shows an arrangement in which a capacitor contact (C) can form part of a storage node. A first access device 916 can connect a bit line to the storage node. A second access device 918 can connect a programmable element (via R1) to a storage node. FIG. 9D can be one very particular implementation of that shown in FIG. 4.

Figure 10A:
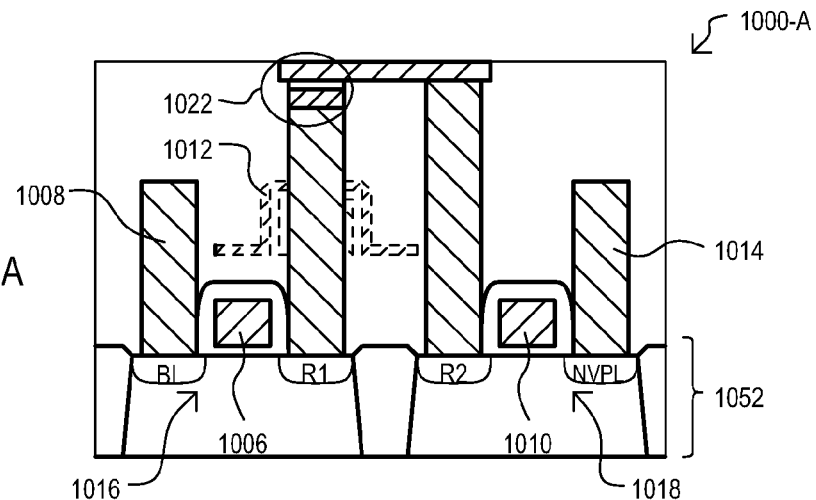
FIGS. 10A to 10C are side cross sectional views showing memory cells with access devices formed in a same substrate according to various embodiments.
Figure 10B:
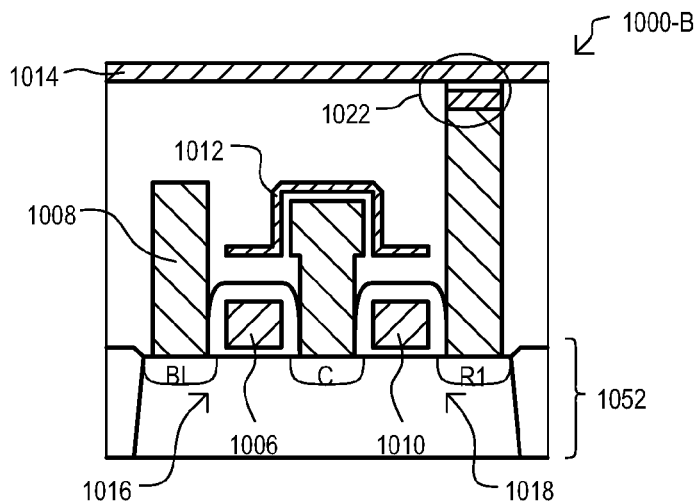
Figure 10C:
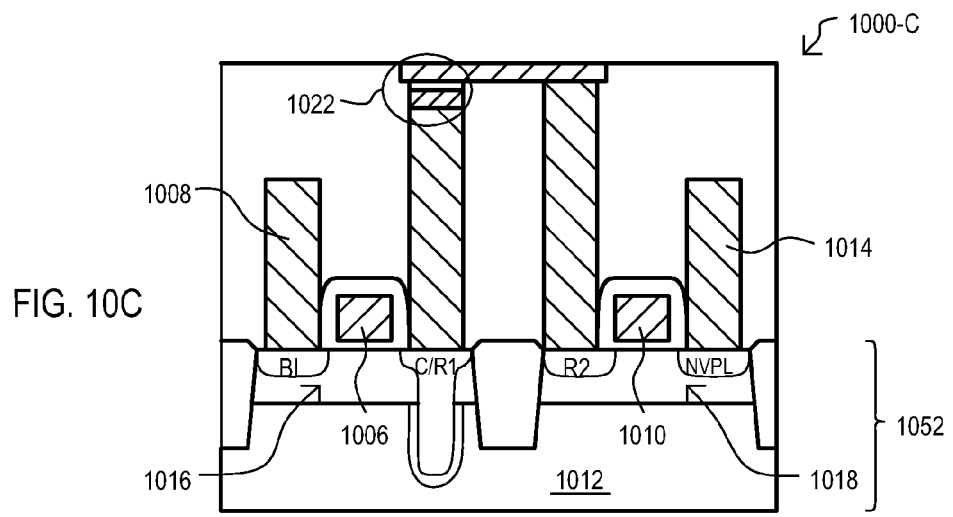

FIGS. 10A to 10C are side cross sectional views of memory cells (1000-A/B/C) according to various embodiments in which first and second access devices can be insulated gate field effect (MOS type) transistors formed in a same substrate. Further, a dynamic storage section element can be a storage capacitor.

Each of FIGS. 10A to 100 shows a first access device 1016 and a second access device 1018, formed in a substrate 1052, where gates of such access devices can be formed by first and second word lines 1006/1010. Each memory cell (1000-A/B/C) can include a programmable impedance element 1022. In particular embodiments, a programmable impedance element 1022 can be formed at the back-end-of-line (BEOL) of a manufacturing process (i.e., after transistors 1016/1018 have been formed). Contacts to bit lines 1008 are shown as BL, contacts to element 1022 are shown as R1/R2, contacts to second common nodes 1014 are shown as NVPL, and contacts to capacitors are shown as C. Each of FIGS. 10A to 100 also shows a first common node 1012.

FIG. 10A is a side cross sectional view of a memory cell 1000-A according to an embodiment. FIG. 10A can be one implementation of that shown in FIG. 9A. In the view of FIG. 10A, a capacitor (which can include first common node 1012) is understood to be "behind" contact R1 that rises vertically to element 1022.

FIG. 10B is a side cross sectional view of a memory cell 1000-B according to another embodiment. FIG. 10B can be one implementation of that shown in FIG. 9D.

FIG. 10C is a side cross sectional view of a memory cell 1000-C according to a further embodiment. FIG. 10C can be like that that shown in FIG. 9A. However, because a capacitor is a trench capacitor (in this case with a substrate plate), a contact for the capacitor and element can be the same (C/R1). Further, a substrate 1052 can include a first common node 1012, formed by a substrate region doped differently from those of the transistors 1016/1018.

As noted above, while some embodiments can include first and second access devices formed in a same substrate, in other embodiments, one or both access devices can be formed at different vertical levels than a substrate. As but one example, one access device can be a transistor formed in a monocrystalline substrate, while another access device can be a thin-film transistor formed over the monocrystalline substrate.

Figures 11A, 11B:
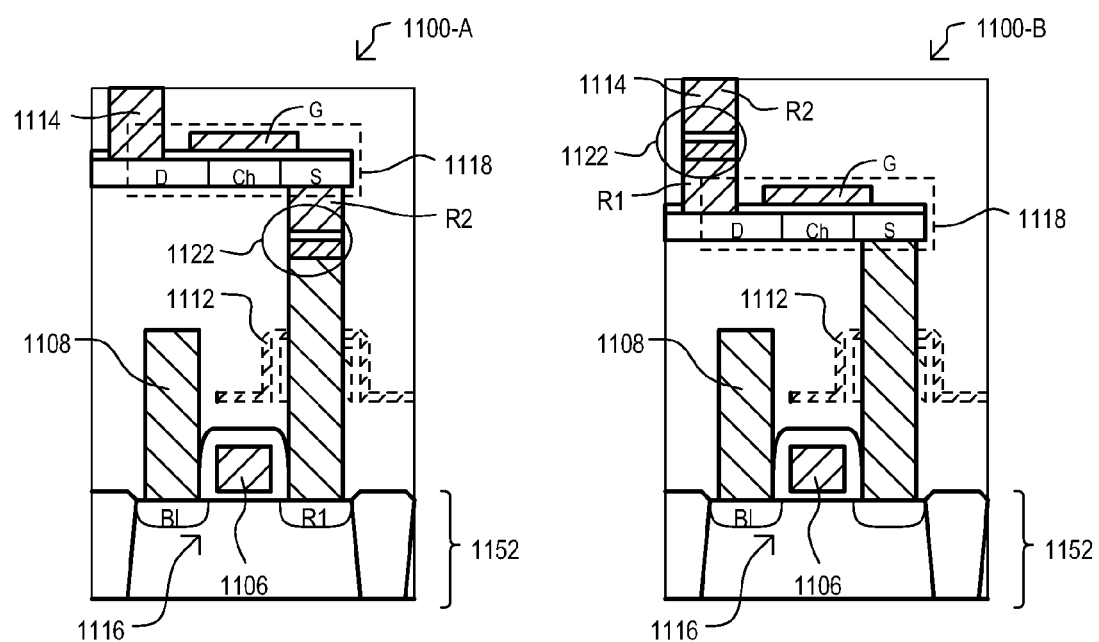
FIGS. 11A and 11B are side cross sectional views showing memory cells with an access device formed above a substrate according to embodiments.

FIGS. 11A and 11B show memory cells 1100-A/B according to further embodiments. Memory cells 1100-A/B can include items like those of FIG. 10A, and such like items are referred to by the same reference character, but with the leading digits being "11" instead of "10".

FIG. 11A can differ from that of FIG. 10A, in that a second access device 1118 can be a thin-film transistor formed over a substrate 1152. A thin film transistor 1118 can include a source (S), drain (D), channel (Ch), and gate (G). Thin film transistor 1118 can connect a second terminal (R2) of element 1122 to a second common node 1114. FIG. 11A can be one implementation of that shown in FIGS. 3 and/or 6.

FIG. 11B can differ from that of FIG. 10A, in that a second access device 1118 can be a thin-film transistor formed over a substrate 1152. A thin film transistor 1118 can include a source (S), drain (D), channel (Ch), and gate (G). Thin film transistor 1118 can connect a first access device (transistor) 1116 to a first terminal (R1) of element 1122.

While FIGS. 11A/B show a capacitor formed over a substrate 1152, other embodiments can include a capacitor formed in a substrate 1152, as shown in FIG. 10C.

While embodiments above have shown various memory cells, devices and corresponding methods, additional methods will now be described with reference to flow diagrams.

Figure 12:
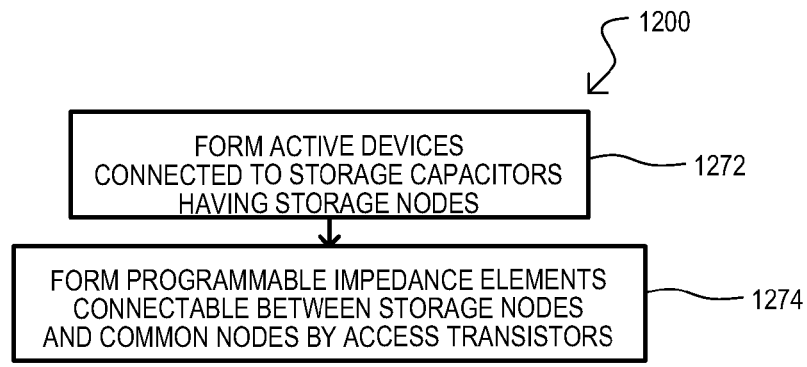
FIG. 12 is a flow diagram of a method according to one embodiment.

FIG. 12 is a flow diagram of a method 1200 according to one embodiment. A method 1200 can include forming active devices connected to storage capacitors having storage nodes (1272). In some embodiments, such an action can include forming transistors in a substrate (and/or over a substrate), where such transistors have a source or drain connected to one plate of a storage capacitor. Such an action can include forming substrate transistors and/or capacitors as shown in FIGS. 10A to 11B.

A method 1200 can also include forming programmable impedance elements that are connectable between storage nodes and access transistors (1274). In some embodiments, such an action can include forming a programmable impedance element in series between a common node and a storage node, and shown in FIGS. 3, 4 and 6). In particular embodiments, such an action can include forming programmable elements as shown in FIGS. 10A to 11B, and/or thin film transistors as shown in FIGS. 11A and 11B.

Figure 13:
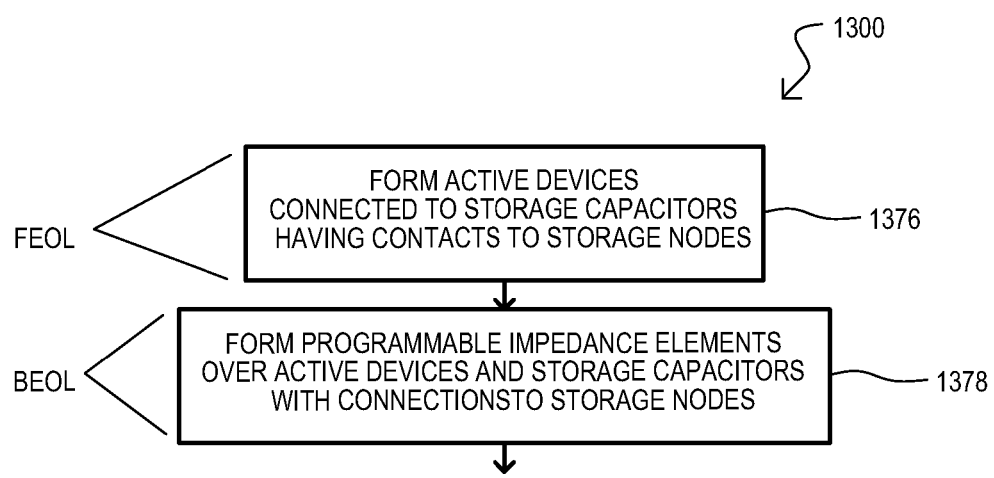
FIG. 13 is a flow diagram of a method according to another embodiment.

FIG. 13 is a flow diagram of a method 1300 according to another embodiment. A method 1300 can include forming active devices connected to storage capacitors having contacts to storage nodes (1376). As shown, the formation of the active devices can occur at a front-end-of-line (FEOL). In some embodiments, such an action can include forming transistors in a substrate, with sources or drains connected to a terminal of a storage capacitor. The storage capacitor can be formed in a substrate or over a substrate. Such an action can include forming substrate transistors and/or capacitors as shown in FIGS. 10A to 11B.

Programmable impedance elements can be formed over active devices and storage capacitors. Such elements can have connections to storage nodes (1378). As shown, the formation of the programmable impedance elements can occur at a back-end-of-line (BEOL). In some embodiments, such an action can include forming programmable impedance elements on existing interconnect layers in a conventional DRAM process. Such an action can include forming programmable impedance elements as shown in FIGS. 10A to 11B.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
    a plurality of memory cells, each including
        a dynamic section configured to store data dynamically, and
        a programmable impedance section comprising at least one element programmable between at least two different impedance states, the programmable impedance section configured to establish a data value stored by the dynamic section in response to a predetermined indication.

2. The memory device of claim 1, wherein:
    the memory cells are arranged into an array of rows and columns, each row of memory cells being coupled to a same word line and each column of memory cells being coupled to a same bit line.

3. The memory device of claim 1, wherein:
    each element is a two terminal element having a solid ion conductor disposed between two electrodes.

4. The memory device of claim 1, wherein:
    each dynamic section includes
    a first access device to electrically connect a bit line to a storage node, and
    a dynamic element coupled between the storage node and a first node, the dynamic element losing a stored data value after power is removed from the memory device.

5. The memory device of claim 4, wherein:
    each dynamic element comprises a storage capacitor.

6. The memory device of claim 4, wherein:
    each programmable impedance section includes a second access device to electrically connect the element to a second node, and
the element is coupled between the storage node and the second access device.
7. The memory device of claim 4, wherein:
each programmable impedance section includes
a second access device to electrically connect the element to the storage second node, and
the element is coupled between the second access device and a second storage node.
8. The memory device of claim 7, wherein:
each first access device comprises a first transistor formed in a semiconductor substrate; and
each programmable impedance section includes a second access device comprising a second transistor formed in the semiconductor substrate.
9. The memory device of claim 4, wherein:
each programmable impedance section includes at least one second access device comprising a thin film transistor formed over the semiconductor substrate.
10. A memory device, comprising:
a plurality of first word lines, each first word line coupled to memory cells of a same row;
a plurality of second word lines, each second word line coupled to memory cells of a same row; and
each memory cell configured to connect a first element to a bit line according to a signal on the first word line, and connect a second element between the first element and a first common node according to a signal on the second word line; wherein
each first element is a dynamic storage element that loses a stored value in an absence of power to the memory device, and each second element is programmable between at least two different impedance states and comprises a solid ion conductor between two electrodes.
11. The memory device of claim 10, wherein:
each memory cell of the same row includes
the first element coupled between a second common node and a storage node, and
a first access device coupled between the storage node and a bit line, having a control terminal coupled to the corresponding first word line.
12. The memory device of claim 11, wherein:
each memory cell of the same row includes
the second element coupled between the storage node and a second access device, and
the second access device is coupled between the second element and the second common node, and has a control terminal coupled to the corresponding second word line.

13. The memory device of claim 10, wherein:
each first element comprises a capacitor.
14. The memory device of claim 10, further including:
a command decoder configured to generate at least store, recall and standard indications in response to received input signals;
a first word line driver that drives signals on first word lines in response to at least a standard indication; and
a second word line driver that drives signals on second word lines in response to a store or recall indication.
15. A method, comprising:
in a standard mode of operation, accessing dynamic elements of memory cells;
in a store mode of operation, establishing impedance states of programmable impedance elements in the memory cells according to data values stored by the dynamic elements of the same memory cells; and
in a recall mode of operation, establishing data values stored by the dynamic elements of memory cells according to the impedance state of the programmable impedance elements of the same memory cells;
wherein
the programmable impedance elements comprise a solid ion conductor disposed between two electrodes.
16. The method of claim 15, wherein:
accessing the dynamic elements of memory cells includes connecting capacitors to bit lines with first transistors.
17. The method of claim 15, wherein:
the dynamic elements comprise capacitors; and
establishing the impedance states of programmable impedance elements includes connecting programmable impedance elements between the capacitors of the same memory cells, to generate voltages across the programmable impedance elements that varies according to a charge stored on the capacitors.
18. The method of claim 15, wherein:
the dynamic elements comprise capacitors; and
establishing data values stored by the dynamic elements includes connecting the capacitors to a bias voltage via the programmable impedance elements of the corresponding cells.
19. The method of claim 15, further including:
entering the store mode of operation in response to a device entering a lower power mode of operation.
20. The method of claim 19, further including:
entering the recall mode of operation in response to the device leaving the lower power mode of operation.

* * * * *